(12) United States Patent
Jang et al.

(10) Patent No.: US 12,326,632 B2
(45) Date of Patent: Jun. 10, 2025

(54) DISPLAY APPARATUS

(71) Applicant: SAMSUNG ELECTRONICS CO., LTD., Suwon-si (KR)

(72) Inventors: Hyukjun Jang, Suwon-si (KR); Yonghun Kwon, Suwon-si (KR); Sunyoung Kim, Suwon-si (KR); Taeyeon Kim, Suwon-si (KR); Hyungsuk Kim, Suwon-si (KR); Seungyong Shin, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/414,029

(22) Filed: Jan. 16, 2024

(65) Prior Publication Data

US 2024/0310676 A1   Sep. 19, 2024

Related U.S. Application Data

(63) Continuation of application No. PCT/KR2023/095127, filed on Dec. 20, 2023.

(30) Foreign Application Priority Data

Mar. 17, 2023 (KR) .......................... 10-2023-0035382

(51) Int. Cl.
   *G02F 1/1335* (2006.01)
   *G02F 1/13357* (2006.01)
   (Continued)

(52) U.S. Cl.
   CPC .. *G02F 1/133612* (2021.01); *G02F 1/133603* (2013.01); *G09G 3/3426* (2013.01); *H01L 25/167* (2013.01); *G09G 2320/0646* (2013.01)

(58) Field of Classification Search
   None
   See application file for complete search history.

(56) References Cited

U.S. PATENT DOCUMENTS

| | | |
|---|---|---|
| 8,067,897 B2 | 11/2011 | Park et al. |
| 9,857,632 B2 | 1/2018 | Lee et al. |

(Continued)

FOREIGN PATENT DOCUMENTS

| | | |
|---|---|---|
| KR | 10-2010-0025872 A | 3/2010 |
| KR | 10-2016-0084937 A | 7/2016 |

(Continued)

OTHER PUBLICATIONS

International Search Report dated Apr. 9, 2024, issued by the International Searching Authority in International Application No. PCT/KR2023/095127.

(Continued)

*Primary Examiner* — Stephen T. Reed
(74) *Attorney, Agent, or Firm* — Sughrue Mion, PLLC

(57) ABSTRACT

A display apparatus includes: a substrate; a plurality of driving regions arranged in a plurality of rows and a plurality of columns on the substrate, each of the plurality of driving regions comprising a plurality of light emitting devices; and a plurality of driving devices configured to drive the plurality of light emitting devices of the plurality of driving regions, wherein a first driving device of the plurality of driving devices is provided in a first driving region of the plurality of driving regions, and a second driving device of the plurality of driving devices is configured to drive the plurality of light emitting devices of the first driving region.

12 Claims, 9 Drawing Sheets

(51) Int. Cl.
*G09G 3/34* (2006.01)
*H01L 25/16* (2023.01)

(56) References Cited

U.S. PATENT DOCUMENTS

| | | |
|---|---|---|
| 10,670,918 B2 | 6/2020 | Lee et al. |
| 11,436,970 B2 | 9/2022 | Gray et al. |
| 2002/0067322 A1 | 6/2002 | Yanagawa et al. |
| 2010/0052564 A1 | 3/2010 | Park et al. |
| 2016/0195772 A1 | 7/2016 | Lee et al. |
| 2016/0242257 A1 | 8/2016 | Duan |
| 2018/0143495 A1 | 5/2018 | Lee et al. |
| 2022/0020310 A1 | 1/2022 | Gray et al. |
| 2022/0020316 A1* | 1/2022 | Gray .................. G09G 3/32 |
| 2022/0172672 A1 | 6/2022 | Park et al. |
| 2022/0225481 A1 | 7/2022 | Jung et al. |
| 2023/0335071 A1 | 10/2023 | Kim et al. |
| 2024/0036398 A1 | 2/2024 | Shin et al. |

FOREIGN PATENT DOCUMENTS

| | | |
|---|---|---|
| KR | 10-2018-0062224 A | 6/2018 |
| KR | 10-2022-0009903 A | 1/2022 |
| KR | 10-2022-0076107 A | 6/2022 |
| KR | 10-2022-0102870 A | 7/2022 |
| KR | 10-2022-0139269 A | 10/2022 |
| KR | 10-2024-0015001 A | 2/2024 |
| WO | 2022/181962 A1 | 9/2022 |

OTHER PUBLICATIONS

Written Opinion dated Apr. 9, 2024, issued by the International Searching Authority in International Application No. PCT/KR2023/095127.

* cited by examiner

FIG. 9

| MODULE CONDITION | TEMPERATURE IN EXISTING DESIGN | TEMPERATURE IN DESIGN OF DISCLOSURE | EFFECT |
|---|---|---|---|
| P-IC | 71.7℃ | 54.7℃ | REDUCTION EFFECT OF 17℃ |
| PCB | 47.4℃ | 40.5℃ | REDUCTION EFFECT OF 6.9℃ |

DISPLAY APPARATUS

CROSS-REFERENCE TO RELATED APPLICATIONS

This application is a by-pass continuation application of International Application No. PCT/KR2023/095127, filed on Dec. 20, 2023, which is based on and claims priority to Korean Patent Application No. 10-2023-0035382, filed on Mar. 17, 2023, in the Korean Intellectual Property Office, the disclosures of which are incorporated by reference herein their entireties.

BACKGROUND

1. Field

The disclosure relates to a display apparatus, and more particularly, to a display apparatus including a liquid crystal panel and a backlight unit (BLU).

2. Description of Related Art

In general, display apparatuses are output devices for displaying obtained or stored electrical information by converting the electrical information to visual information, and are used in various fields such as homes or workplaces.

The display apparatus may include a backlight unit (BLU) for providing light to a liquid crystal panel. The BLU includes a plurality of dot light emitting devices each capable of emitting light separately. The light emitting device includes, for example, light emitting diodes (LEDs) or organic LEDs (OLEDs).

A local dimming technology (for example, in a BLU of an LED TV) is a primary technology to increase contrast ratios of the display. A local dimming system may divide a display screen into multiple sections, and separately perform a current control for each section based on an input image. Hence, contrast ratios may be effectively enhanced by reducing the current amount when the input image is dark and increasing the current amount when the input image is bright.

However, bright image data may be input to a section for long hours, and thus, a high current may be constantly applied to the section, which causes a sharp temperature rise in the display. Thus, a method of reducing the temperature rise in the display apparatus is required.

SUMMARY

Provided are a display apparatus that may reduce excessive temperature rise in the display apparatus by placing light emitting devices and a driving device for driving the light emitting devices in different regions.

Additional aspects will be set forth in part in the description which follows and, in part, will be apparent from the description, or may be learned by practice of the presented embodiments.

According to an aspect of the disclosure, a display apparatus includes: a substrate: a plurality of driving regions arranged in a plurality of rows and a plurality of columns on the substrate, each of the plurality of driving regions comprising a plurality of light emitting devices; and a plurality of driving devices configured to drive the plurality of light emitting devices of the plurality of driving regions, wherein a first driving device of the plurality of driving devices is provided in a first driving region of the plurality of driving regions, and a second driving device of the plurality of driving devices is configured to drive the plurality of light emitting devices of the first driving region.

The first driving device may be configured to drive the plurality of light emitting devices of a second driving region of the plurality of driving regions, and wherein the first driving region and the second driving region may be in different rows of the plurality of rows.

The second driving device may be provided in the second driving region, and wherein the first driving region may be in a first row of the plurality of rows and the second driving region may be in a third row of the plurality of rows.

The second driving device may be configured to apply a second driving current to the plurality of light emitting devices in the first driving region in the first row, and wherein the first driving device may be configured to apply a first driving current to the plurality of light emitting devices in the second driving region in the third row.

The second driving device may be provided in the second driving region, and wherein the first driving region is in a second row of the plurality of rows and the second driving region is in a fourth row of the plurality of rows.

The second driving device may be configured to apply a second driving current to the plurality of light emitting devices of the first driving region in the second row, and wherein the first driving device may be configured to apply a first driving current to the plurality of light emitting devices of the second driving region in the fourth row on the substrate.

The first driving device may be configured to drive the plurality of light emitting devices of a second driving region of the plurality of driving regions, and wherein the first driving region and the second driving region may be in different columns of the plurality of columns.

A second driving device may be provided in the second driving region, and wherein the first driving region may be in a first column of the plurality of columns and the second driving region may be in third column of the plurality of columns.

A predetermined number of light emitting devices among the plurality of light emitting devices may correspond to one dimming block, and wherein each driving region may include a predetermined number of dimming blocks.

Each of the plurality of driving devices may be provided on an upper surface of the substrate or a lower surface of the substrate.

According to an aspect of the disclosure, a display apparatus includes: a substrate comprising a plurality of driving regions arranged in a plurality of row and columns, each of the plurality of driving regions comprising a plurality of light emitting devices; and a plurality of driving devices provided in the plurality of driving regions, wherein each driving device is configured to drive the plurality of light emitting devices of a driving region other than a driving region in which the driving device is provided.

A first driving device of the plurality of driving devices may be provided in a first driving region of the plurality of driving regions, wherein a second driving device of the plurality of driving devices may be provided in a second driving region of the plurality of driving regions, wherein the first driving device may be configured to drive the plurality of light emitting devices of the second driving region, and wherein the second driving device may be configured to drive the plurality of light emitting devices of the first driving region.

The first driving region and the second driving region may be in different rows of the plurality of rows.

The first driving region and the second driving region may be in different columns of the plurality of columns.

According to embodiments of the disclosure, an excessive temperature rise in the display apparatus may be reduced by arranging light emitting devices and a driving device configured to drive the light emitting devices in different regions.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 9 illustrates a temperature difference in a display apparatus between an embodiment of the disclosure and an existing embodiment.

DETAILED DESCRIPTION

Figure 1:
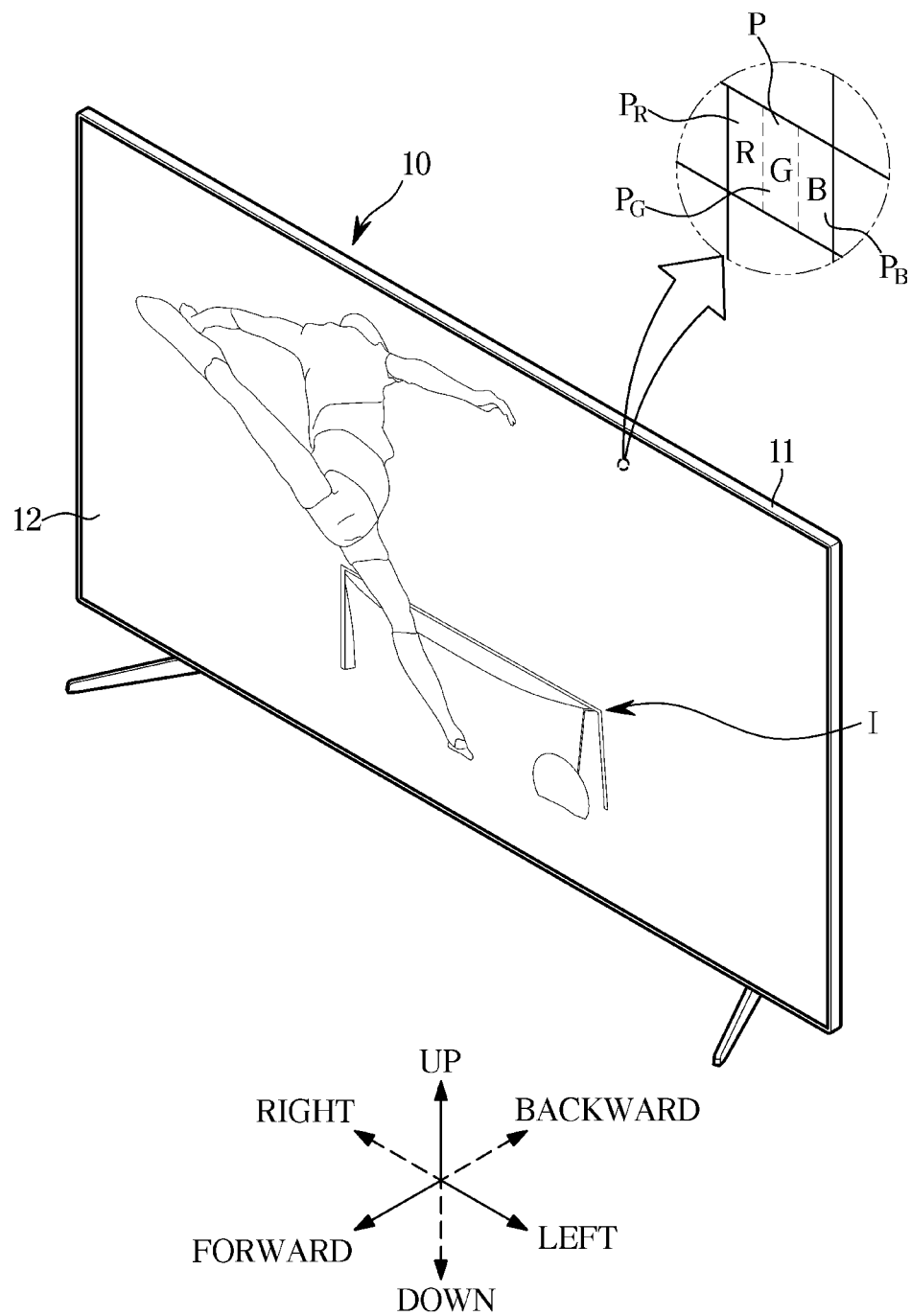
FIG. 1 illustrates an exterior of a display apparatus, according to an embodiment.

Embodiments and features as described and illustrated in the disclosure are merely examples, and there may be various modifications replacing the embodiments and drawings at the time of filing this application.

Throughout the drawings, like reference numerals refer to like parts or components.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

Furthermore, throughout the specification, when a component is "connected" or "coupled" to another component, it includes not only a case that the component is directly connected or coupled to the other component but also a case that they are indirectly connected or coupled to each other.

The terms including ordinal numbers like "first" and "second" may be used to explain various components, but the components are not limited by the terms. The terms are only for the purpose of distinguishing a component from another. Thus, a first component discussed below could be termed a second component and vice versa, without departing from the teachings of the disclosure. Descriptions shall be understood as to include any and all combinations of one or more of the associated listed items when the items are described by using the conjunctive term "~and/or~," or the like.

The term "or" is an inclusive term meaning "and/or". The phrase "at least one of," when used with a list of items, means that different combinations of one or more of the listed items may be used, and only one item in the list may be needed. For example, "at least one of A, B, and C" includes any of the following combinations: A, B, C, A and B, A and C, B and C, and A and B and C, and any variations thereof. The expression "at least one of a, b, or c" may indicate only a, only b, only c, both a and b, both a and c, both b and c, all of a, b, and c, or variations thereof. Similarly, the term "set" means one or more. Accordingly, the set of items may be a single item or a collection of two or more items.

Reference will now be made to embodiments of the disclosure, which are illustrated in the accompanying drawings.

FIG. 1 illustrates an exterior of a display apparatus, according to an embodiment of the disclosure.

Referring to FIG. 1, a display apparatus 10 is able to process image signals received from the outside and visually present the processed image. In the following description, the display apparatus 10 is a television (TV), but embodiments of the disclosure are not limited thereto. For example, the display apparatus 10 may be implemented in various forms, such as a monitor, a portable multimedia device, a portable communication device, and any device capable of visually presenting images, without being limited thereto.

The display apparatus 10 may be a large format display (LFD) installed outdoors such as on a rooftop of a building or at a bus stop. The display apparatus 10 is not, however, exclusively installed outdoors, but may be installed at any place, even indoors with a lot of foot traffic, e.g., at subway stations, shopping malls, theaters, offices, stores, etc.

The display apparatus 10 may receive contents including video and audio signals from various content sources and output video and audio corresponding to the video and audio signals. For example, the display apparatus 10 may receive content data through a broadcast receiving antenna or a cable, receive content data from a content reproducing device, or receive content data from a content providing server of a content provider.

As shown in FIG. 1, the display apparatus 10 may include a main body 11 and a screen 12 for displaying an image I.

The main body 11 forms the exterior of the display apparatus 10, and components for the display apparatus 10 to display the image I or perform many different functions may be included in the main body 11. Although the main body 11 of FIG. 1 is shaped like a flat plate, the main body 11 is not limited thereto. For example, the main body 11 may have the form of a curved plate.

The screen 12 may be provided on the front of the main body 11 for displaying the image I. For example, the screen 12 may display still images or moving images. The screen 12 may also display two-dimensional (2D) plane images, or three dimensional (3D) stereographic images using parallax of both eyes of the user.

The screen 12 may include a liquid crystal panel capable of transmitting or blocking light emitted by a backlight unit (BLU).

A plurality of pixels P are formed on the screen 12, and the image I displayed on the screen 12 may be formed by the light emitted by each of the plurality of pixels P. For example, the light emitted by each of the plurality of pixels P may be combined like a mosaic into the image I on the screen 12.

The plurality of pixels P may emit light in various colors and brightness. Each of the pixels P may include subpixels PR, PG, and PB to emit different colors of light.

The subpixels PR, PG, and PB may include a red subpixel PR to emit red light, a green subpixel PG to emit green light, and a blue subpixel PB to emit blue light. For example, the red light may refer to light having wavelengths in the range of about 700 nanometer (nm) to 800 nm, where 1 nm is a billionth of a meter. The green light may have wavelengths in the range of about 500 nm to 600 nm. The blue light may have wavelengths in the range of about 400 nm to 500 nm.

By combinations of the red light of the red subpixel PR, the green light of the green subpixel PG, and the blue light of the blue subpixel PB, each of the pixels P may emit light in various brightness and colors.

Figure 2:
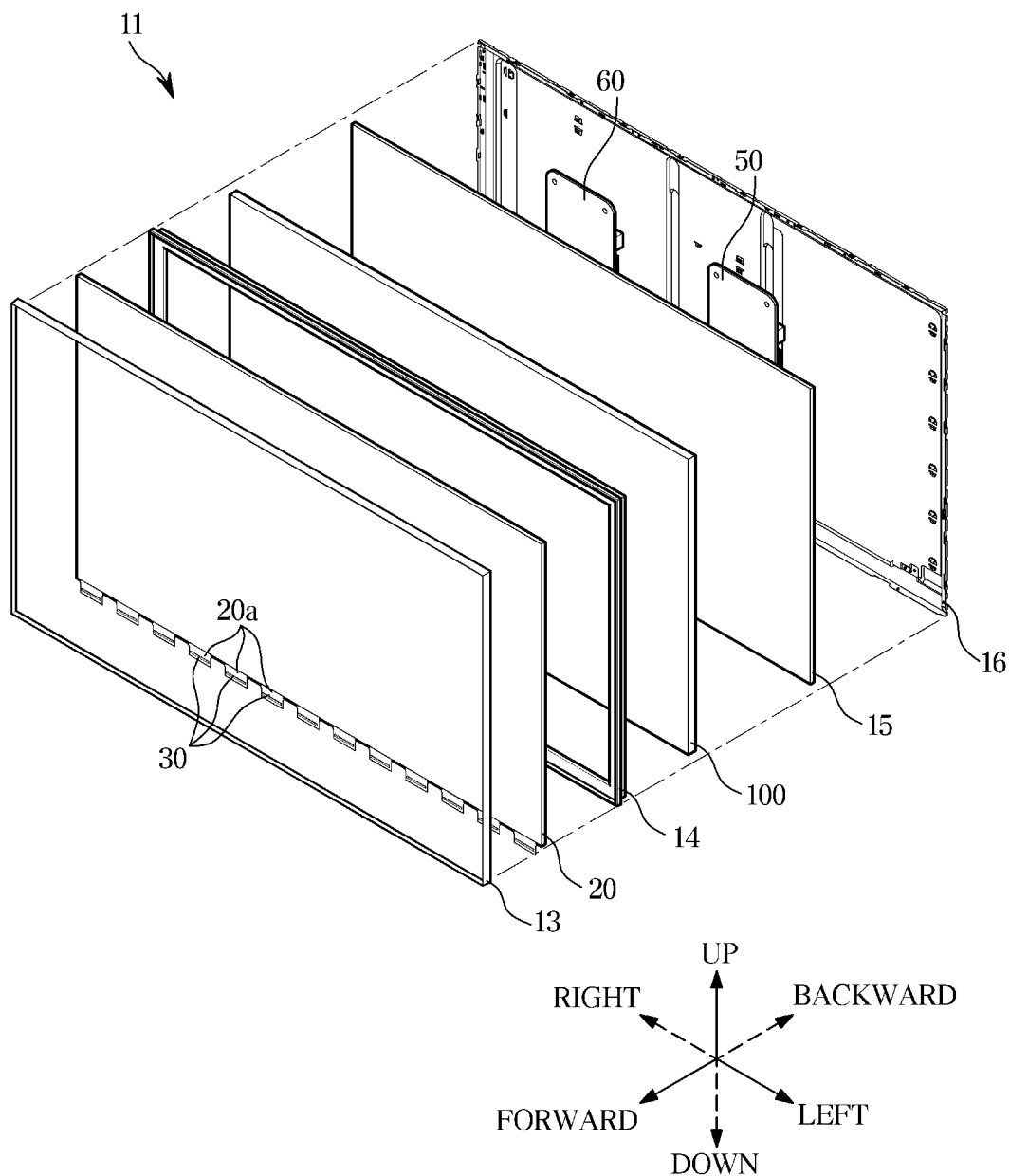
FIG. 2 illustrates a structure of a display apparatus, according to an embodiment.
Figure 3:
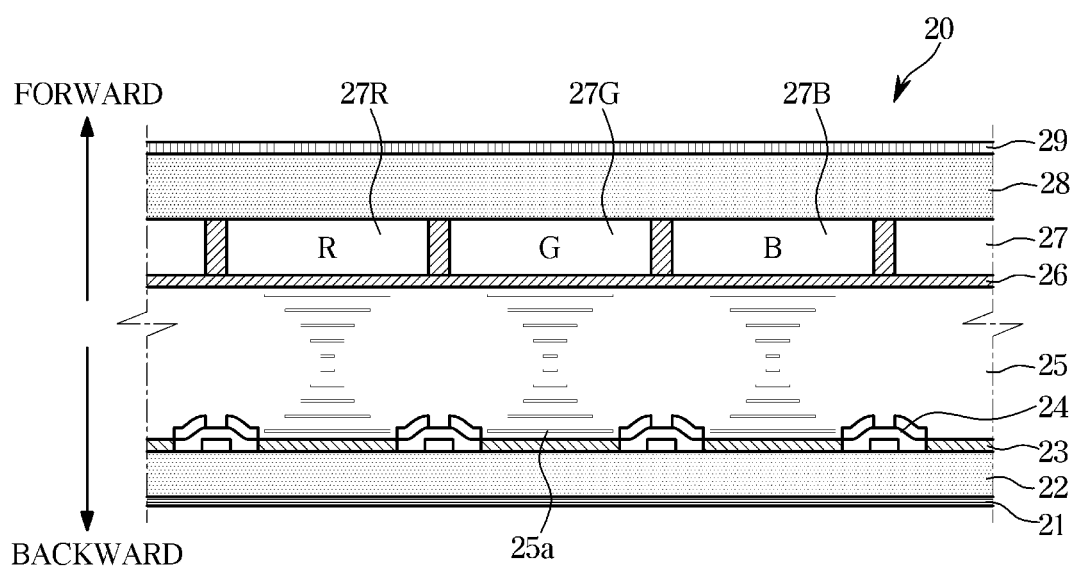
FIG. 3 illustrates a liquid crystal panel included in a display apparatus, according to an embodiment.

FIG. 2 illustrates a structure of the display apparatus 10, according to an embodiment of the disclosure. FIG. 3 illustrates a liquid crystal panel included in the display apparatus 10, according to an embodiment of the disclosure.

As shown in FIG. 2, the main body 11 may contain many different kinds of components to create the image I on the screen S.

For example, the main body 11 is equipped with a backlight unit (BLU) 100, which is a surface light source, a liquid crystal panel 20 for blocking or transmitting light emitted from the BLU 100, a control assembly 50 for controlling operations of the BLU 100 and the liquid crystal panel 20, and a power assembly 60 for supplying power to the BLU 100 and the liquid crystal panel 20. Furthermore, the main body 11 may include a bezel 13, a frame middle mold 14, a bottom chassis 15, and a rear cover 16 to support the liquid crystal panel 20, the BLU 100, the control assembly 50, and the power assembly 60.

The BLU 100 may include point light sources for emitting white light. The BLU 100 may refract, reflect, and diffuse the light emitted from the point light sources to convert the light to uniform surface light. In this way, the BLU 100 may emit uniform surface light in a forward direction by refracting, reflecting and diffusing light emitted from the point light sources.

The BLU 100 will now be described in more detail.

The liquid crystal panel 20 is arranged in front of the BLU 100 for blocking or transmitting light emitted from the BLU 100 to form the image I.

The front surface of the liquid crystal panel 20 may form the screen S of the aforementioned display apparatus 10, and the liquid crystal panel 20 may include the plurality of pixels P. The plurality of pixels P of the liquid crystal panel 20 may block or transmit light from the BLU 100 separately. The light transmitted by the plurality of pixels P may form the image I displayed on the screen S.

For example, as shown in FIG. 3, the liquid crystal panel 20 may include a first polarizer film 21, a first transparent substrate 22, a pixel electrode 23, a thin film transistor (TFT) 24, a liquid crystal layer 25, a common electrode 26, a color filter 27, a second transparent substrate 28, and a second polarizer film 29.

The first transparent substrate 22 and the second transparent substrate 28 may securely support the pixel electrode 23, the thin-film-transistor (TFT) 24, the liquid crystal layer 25, the common electrode 26, and the color filter 27. The first transparent substrate 22 and the second transparent substrate 28 may be formed of tempered glass or transparent resin.

The first polarizer film 21 and the second polarizer film 29 are arranged on outer sides of the first transparent substrate 22 and the second transparent substrate 28. Each of the first polarizer film 21 and the second polarizer film 29 may pass particularly polarized light while blocking (reflecting or absorbing) differently polarized light. For example, the first polarizer film 21 may pass polarized light of a first direction while blocking (reflecting or absorbing) differently polarized light. Furthermore, the second polarizer film 29 may pass polarized light of a second direction while blocking (reflecting or absorbing) differently polarized light. The first direction and the second direction may be perpendicular to each other. As a result, the polarized light that has passed the first polarizer film 21 may not directly pass the second polarizer film 29.

The color filter 27 may be arranged on the inner side of the second transparent substrate 28. The color filter 27 may include, for example, a red color filter 27R for passing red light, a green color filter 27G for passing green light, and a blue color filter 27B for passing blue light. Furthermore, the red color filter 27R, the green color filter 27G, and the blue color filter 27B may be arranged side by side. An area occupied by the color filter 27 corresponds to the pixel P as described above. An area occupied by the red color filter 27R corresponds to the red subpixel PR: an area occupied by the green color filter 27G corresponds to the green subpixel PG: an area occupied by the blue color filter 27B corresponds to the blue subpixel PB.

The pixel electrode 23 may be arranged on the inner side of the first transparent substrate 22, and the common electrode 26 may be arranged on the inner side of the second transparent substrate 28. The pixel electrode 23 and the common electrode 26 may include an electrically conductive metal material, and may produce an electric field to change the layout of liquid crystal molecules 115a that form the liquid crystal layer 25, which will be described below.

The TFT 24 is arranged on the inner side of the second transparent substrate 22. The TFT 24 may be turned on (closed) or turned off (opened) by image data provided from a panel driver 30. Furthermore, depending on whether the TFT 24 is turned on (closed) or turned off (opened), an electric field may be formed or removed from between the pixel electrode 23 and the common electrode 26.

The liquid crystal layer 25 may be formed between the pixel electrode 23 and the common electrode 26 and filled with liquid crystal molecules 25a. The liquid crystals may be in an intermediate state between solid (crystal) and fluid. The liquid crystals may reveal an optical property according to a change in electric field. For example, the liquid crystal may have varying directions of arrangement of molecules that form the liquid crystal, according to a change in electric field. Consequently, the optical property of the liquid crystal layer 25 may be changed according to whether there is an electric field passing the liquid crystal layer 25. For example, the liquid crystal layer 25 may rotate a polarization direction of light around a light axis depending on whether there is an electric field. Hence, the polarized light that has passed the first polarizer film 21 may have a rotating polarization direction while passing the liquid crystal layer 25, and may pass the second polarizer film 29.

On one side of the liquid crystal panel 20, provided are a cable 20a for transmitting image data to the liquid crystal panel 20 and a display driver integrated circuit (DDI) 30 (hereinafter, called a 'panel driver') for processing digital image data to output an analog image signal.

The cable 20a may electrically connect between the control assembly 50/the power assembly 60 and the panel driver 30 and further between the panel driver 30 and the liquid crystal panel 20. The cable 20a may include e.g., a flexible flat cable or a film cable that is bendable.

The panel driver 30 may receive image data and power from the control assembly 50/power assembly 60 through the cable 20a. The panel driver 30 may also provide image data and a driving current to the liquid crystal panel 20 through the cable 20a.

Furthermore, the cable 20a and the panel driver 30 may be integrally implemented as a film cable, a chip on film (COF), a table carrier package (TCP), etc. In other words, the panel driver 30 may be arranged on the cable 20a. It is not, however, limited thereto, and the panel driver 30 may be arranged on the liquid crystal panel 20.

The control assembly 50 may include a control circuit for controlling operations of the liquid crystal panel 20 and the BLU 100. For example, the control circuit may process a video signal and/or an audio signal received from an external content source. The control circuit may transmit image data to the liquid crystal panel 20, and transmit dimming data to the BLU 100.

The power assembly 60 may include a power circuit for supplying power to the liquid crystal panel 20 and the BLU 100. The power circuit may supply power to the control assembly 50, the BLU 100, and the liquid crystal panel 20.

The control assembly 50 and the power assembly 60 may be implemented with printed circuit boards (PCBs) and various circuits mounted on the PCBs. For example, the power circuit may include a power circuit board, and a capacitor, a coil, a resistor, a processor (or a combination of processors), etc., which are mounted on the power circuit board. Furthermore, the control circuit may include a control circuit board with a memory and a processor (or a combination of processors) mounted thereon.

Figure 4:
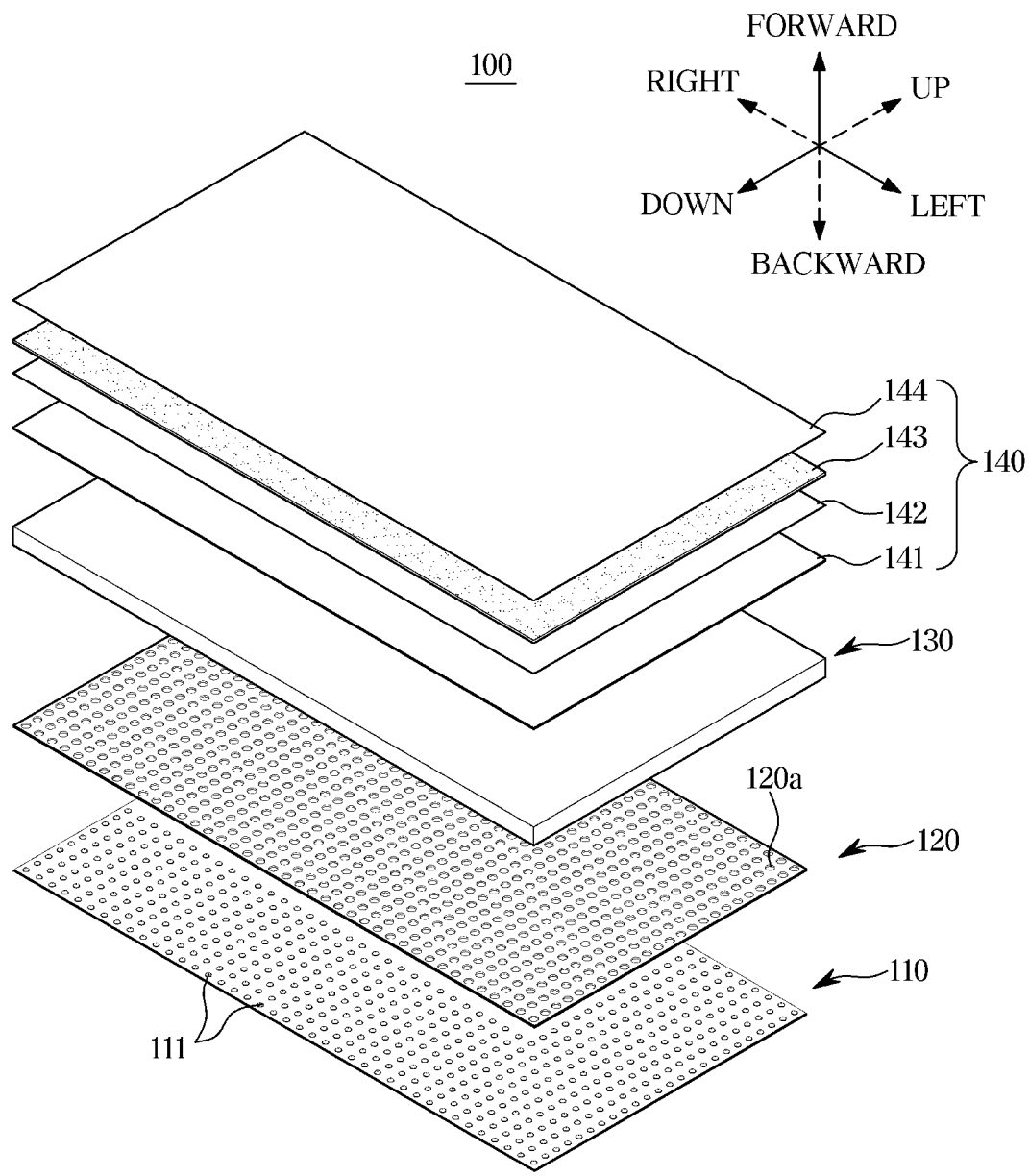
FIG. 4 illustrates a backlight unit (BLU) included in a display apparatus, according to an embodiment.
Figure 5:
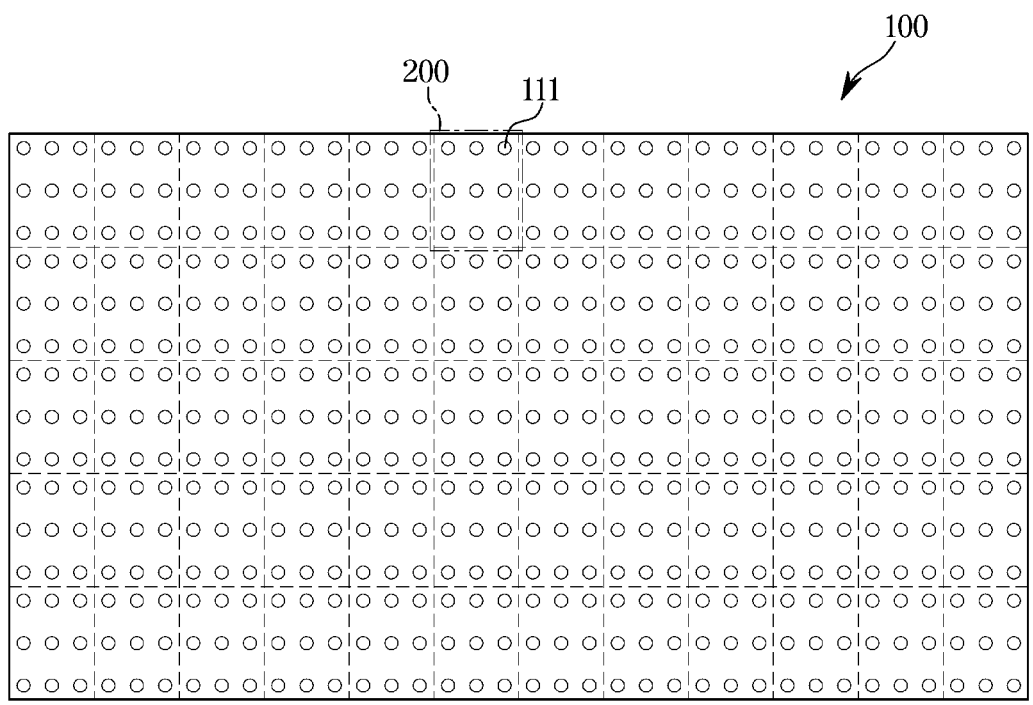
FIG. 5 illustrates a plurality of light emitting diodes (LEDs) in a BLU divided into dimming blocks, according to an embodiment.

FIG. 4 illustrates the BLU 100 included in the display apparatus 10 according to an embodiment, and FIG. 5 is a diagram for describing a plurality of light emitting diodes (LEDs) in the BLU 100 divided into dimming blocks, according to an embodiment.

As shown in FIG. 4, the BLU 100 may include a light source module 110 for generating light, a reflecting sheet 120 for reflecting light, a diffuser plate 130 for uniformly diffusing light, and an optical sheet 140 for enhancing brightness of output light.

The light source module 110 may include a plurality of light emitting devices 111 for emitting light, and a substrate 112 for supporting/fixing the plurality of light emitting devices 111.

The plurality of light emitting devices 111 may be arranged in a predefined pattern to emit light with uniform brightness. The plurality of light emitting devices 111 may be arranged such that a light source is equidistant from its neighboring light sources.

For example, as shown in FIG. 4, the plurality of light emitting devices 111 may be arranged in rows and columns. For example, the plurality of light sources may be arranged such that neighboring four light sources form almost a square. Furthermore, a light source is located to be adjacent to four other light sources, and the distances between the light source and the four neighboring light sources may be almost the same.

Furthermore, in an embodiment, the plurality of light sources may be arranged such that neighboring three light sources form almost a triangle. In this case, a light source may be arranged to be adjacent to six other light sources. The distances between the light source and the six neighboring light sources are almost the same.

The arrangement of the plurality of light emitting devices 111 is not, however, limited thereto, and the plurality of light emitting devices 111 may be arranged in various ways to emit light with uniform brightness.

The plurality of light emitting devices 111 may employ devices capable of emitting monochromatic light (light having a particular wavelength such as blue light) or white light (mixed light of red light, green light, and blue light) to various directions when the plurality of light emitting devices 111 are powered. For example, the plurality of light emitting devices 111 may include LEDs. The LEDs may be implemented in various sizes, including, e.g., mini LEDs and/or micro LEDs.

The substrate 112 may fix the plurality of light emitting devices 111 to prevent the plurality of light emitting devices 111 from being moved. In addition, the substrate 112 may supply power to each of the plurality of light emitting devices 111 so that the plurality of light emitting devices 111 may emit light.

The substrate 112 may fix the plurality of light emitting devices 111, and may include a synthetic resin and/or tapered glass and/or a printed circuit board (PCB) with conductive power supply lines formed therein to supply power to the light emitting devices 111.

The reflecting sheet 120 may reflect light emitted from the plurality of light emitting devices 111 to a forward direction or to an approximate direction to the forward direction.

A plurality of through holes 120a are formed on the reflecting sheet 120 at positions respectively matching the plurality of light emitting devices 111 of the light source module 110. Furthermore, the light emitting devices 111 of the light source module 110 may pass through the through holes 120a and protrude forward from the reflecting sheet 120.

In an embodiment, the plurality of light emitting devices 111 of the light source module 110 are inserted to the plurality of through holes 120a formed at the reflecting sheet 120 during an assembly process of the reflecting sheet 120 and the light source module 110. Hence, the plurality of light emitting devices 111 of the light source module 110 may be located on the front of the reflecting sheet 120 while the substrate 112 of the light source module 110 are located behind the reflecting sheet 120.

Accordingly, the plurality of light emitting devices 111 may emit light from the front of the reflecting sheet 120.

The plurality of light emitting devices 111 may emit light in various directions from the front of the reflecting sheet 120. The light may be emitted not only toward the diffuser plate 130 but also toward the reflecting sheet 120 from the light emitting devices 111, and the reflecting sheet 120 may reflect the light emitted to the reflecting sheet 120 toward the diffuser plate 130.

The light emitted from the plurality of light emitting devices 111 passes various objects such as the diffuser plate 130 and the optical sheet 140. When the light is passing the diffuser plate 130 and the optical sheet 140, a portion of the incident light is reflected from surfaces of the diffuser plate 130 and the optical sheet 140. The reflecting sheet 120 may reflect the light reflected by the diffuser plate 130 and the optical sheet 140.

The diffuser plate 130 may be arranged in front of the light source module 110 and the reflecting sheet 120 to uniformly diffuse the light emitted from the light emitting devices 111 of the light source module 110.

As described above, the plurality of light emitting devices 111 are located everywhere on the rear surface of the BLU 100. The plurality of light emitting devices 111 are equidistantly arranged on the rear surface of the BLU 100, but there may be differences in brightness depending on the positions of the plurality of light emitting devices 111.

In some embodiments, to avoid non-uniformity in brightness caused by the plurality of light emitting devices 111, the diffuser plate 130 may diffuse the light emitted from the plurality of light emitting devices 111 within the diffuser plate 130. In other words, the diffuser plate 130 may uniformly emit non-uniform light forward from the plurality of light emitting devices 111.

An optical sheet 140 may include various sheets to improve brightness and uniformity of the brightness. For example, the optical sheet 140 may include a diffuser sheet 141, a first prism sheet 142, a second prism sheet 143, a reflective polarizer sheet 144, etc.

The diffuser sheet 141 diffuses light for uniformity of brightness. Light emitted from the light emitting devices 111 may be diffused by the diffuser plate 130 and may be further diffused by the diffuser sheet 141 included in the optical sheet 140.

The first prism sheet 142 and the second prism sheet 143 may concentrate the light diffused by the diffuser sheet 141, thereby increasing brightness. The first prism sheet 142 and the second prism sheet 143 may have triangular prism patterns, which are arranged next to each other to form a plurality of bands.

The reflective polarizer sheet 144 is a kind of polarizer film, which may transmit a portion of the incident light while reflecting the other portions to enhance brightness. For example, the reflective polarizer sheet 144 may pass light polarized in the same direction as a predetermined polarization direction of the reflective polarizer sheet 144 and reflect light polarized in a different direction than the predetermined polarization direction. Furthermore, the light reflected by the reflective polarizer sheet 144 may be recycled inside the BLU 100, and this recycling of light may improve brightness of the display apparatus 10.

The optical sheet 140 is not limited to the sheets or films as illustrated in FIG. 4, and may further include other various sheets or films such as protective sheets.

The BLU 100 may include the plurality of light emitting devices 111, and diffuse light emitted from the plurality of light emitting devices 111 to output surface light. The liquid crystal panel 20 may include a plurality of pixels, and control the plurality of pixels each to pass or block light. Light that has passed the plurality of pixels may form an image.

In this case, the display apparatus 10 may perform local dimming that varies brightness of light for each region of the BLU 100 in connection with an output image so as to reduce power consumption while increasing contrast ratios.

For example, the display apparatus 10 may reduce brightness of light of the light emitting devices 111 of the BLU 100 corresponding to a dark portion of the image to further darken the dark portion of the image, and increase brightness of light of the light emitting devices 111 of the BLU 100 corresponding to a bright portion of the image to further brighten the bright portion of the image. Accordingly, the contrast ratio of the image may be enhanced.

The display apparatus 10 divides the BLU 100 into multiple blocks, and separately controls a current for each block based on the input image. Image transmission of the display apparatus 10 proceeds in a method of driving local dimming for each frame, and current driving is controlled according to the number of blocks of the light emitting devices 111 divided in the BLU 100.

As a result, the display apparatus 10 may effectively enhance contrast ratios by reducing the current applied to dimming blocks in a dark region of the input image and increasing the current applied to dimming blocks in a bright region of the input image.

For local dimming, the plurality of light emitting devices 111 included in the BLU 100 may be divided into a plurality of dimming blocks 200. For example, there may be a total of 60 dimming blocks 200 arranged in 5 rows and 12 columns, as shown in FIG. 5. The number of the dimming blocks 200 is not, however, limited thereto.

Referring to FIG. 5, each of the plurality of dimming blocks 200 may include at least one light emitting device of the plurality of light emitting devices 111. The BLU 100 may apply the same driving current to light emitting devices 111 belonging to the same dimming block 200, and the plurality of light emitting devices 111 belonging to the same dimming block 200 may each emit light with the same brightness.

Furthermore, the BLU 100 may apply different driving currents to light emitting devices belonging to different dimming blocks 200 depending on dimming data, and the light emitting devices 111 belonging to the different dimming blocks 200 may emit light with different brightness.

Each of the plurality of dimming blocks 200 may include, for example, N×M light sources arranged in the form of an N×M matrix, where N and M are natural numbers. The N×M matrix refers to a matrix having N rows and M columns.

Each of the plurality of light emitting devices 111 includes an LED, so each of the plurality dimming blocks 200 may include N×M LEDs.

The plurality of dimming blocks 200 may be arranged on the substrate 112. In other words, N×M LEDs may be arranged on the substrate 112.

Figure 6:
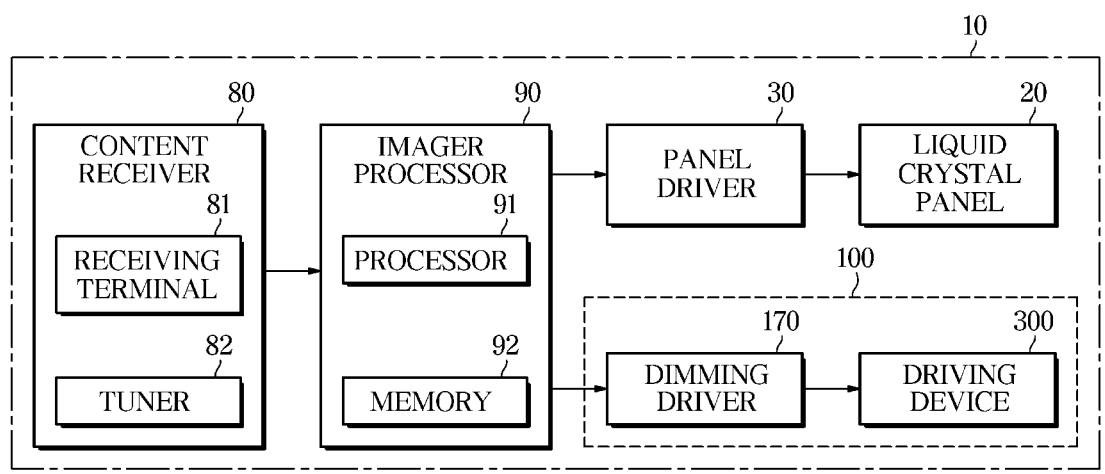
FIG. 6 illustrates a control block diagram of a display apparatus, according to an embodiment.
Figure 7:
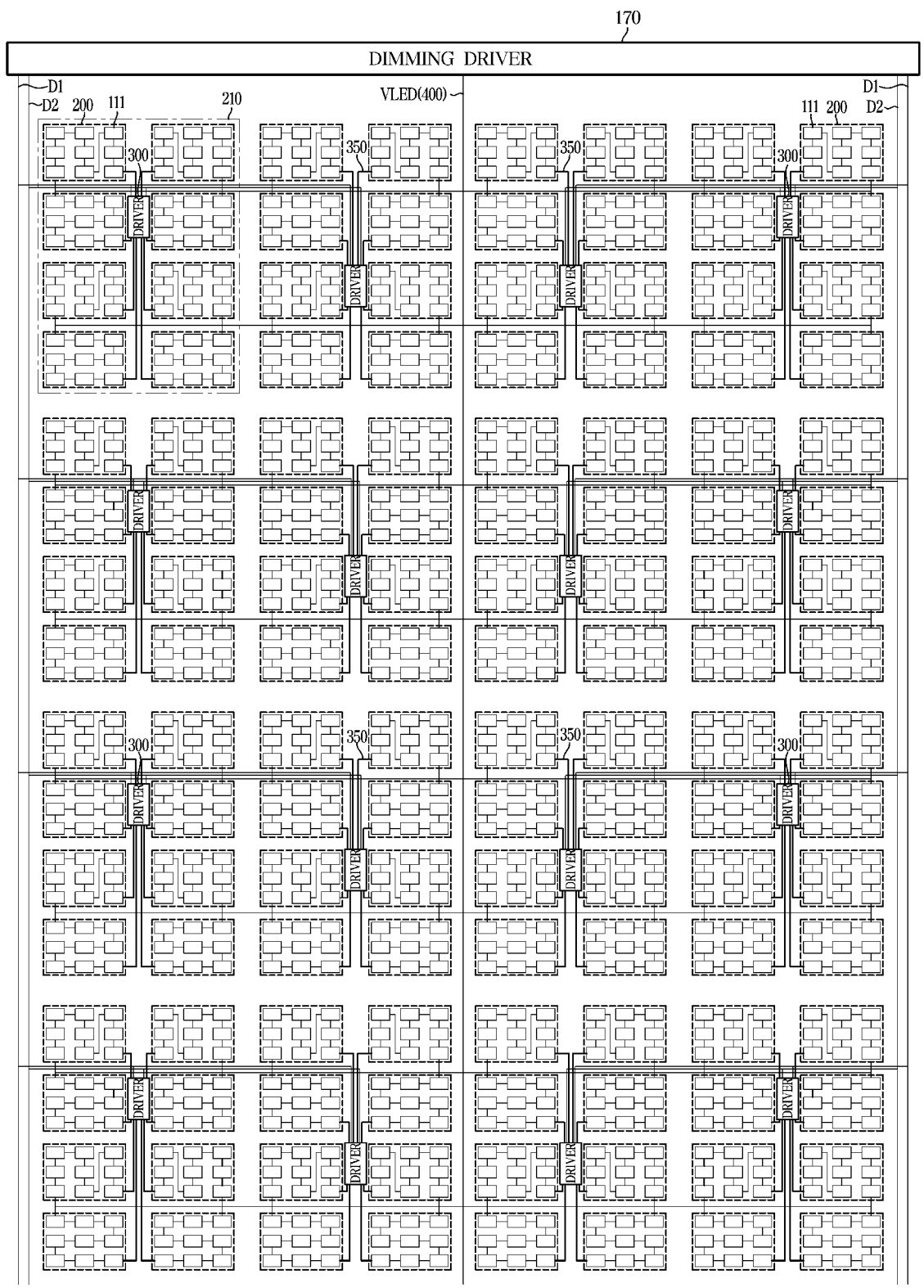
FIG. 7 illustrates a structure of connecting between a dimming driver, driving devices, and dimming blocks of a BLU, in related art.

FIG. 6 is a control block diagram of the display apparatus 10, according to an embodiment. FIG. 7 illustrates a structure of connecting between a dimming driver, driving devices, and dimming blocks of the BLU 100, in related art.

Referring to FIG. 6, the display apparatus 10 may include a content receiver 80, an image processor 90, the panel driver 30, the liquid crystal panel 20 and the BLU 100. In this case, the BLU 100 may include a dimming driver 170 for performing local dimming and a driving device 300 configured to drive the plurality of light emitting devices 111. The content receiver 80 may include a receiving terminal 81 and a tuner 82 for receiving contents including video signals and/or audio signals from content sources.

The receiving terminal 81 may receive video signals and audio signals from the content sources through a cable. For example, the receiving terminal 81 may include a component (YPbPr/RGB) terminal, a composite video blanking and sync (CVBS) terminal, an audio terminal, a high-definition multimedia interface (HDMI) terminal, a universal serial bus (USB) terminal, etc.

The tuner 82 may receive broadcast signals through a broadcast receiving antenna or a cable, and extract a broadcast signal on a channel selected by the user from among the broadcast signals. For example, the tuner 82 may pass a broadcast signal having a frequency corresponding to a channel selected by the user among the plurality of broadcast signals received through the broadcast receiving antenna or the cable, and block broadcast signals having the other frequencies.

As such, the content receiver 80 may receive an image including a video signal and an audio signal from the content sources through the receiving terminals 81 and/or the tuner 82, and output the image input through the receiving terminals 81 and/or the tuner 82 to the image processor 90.

The image processor 90 may include at least one processor 91 for processing the input image (image data) and a memory 92 for memorizing/storing data. The image processor 90 or the at least one processor 91 includes or corresponds to circuitry like a microprocessor unit (MPU), an application processor (AP), a coprocessor (CP), a system-on-chip (SoC), or an integrated circuit (IC)

The memory 92 may store a program and data for processing video signals and/or audio signals, and temporarily store data generated in the process of handling the video signals and/or audio signals.

The memory 92 may include a non-volatile memory, such as a read only memory (ROM), a flash memory, and/or the like, and a volatile memory, such as a static random-access memory (SRAM), a dynamic RAM (DRAM), or the like.

The at least one processor 91 may receive the input image including a video signal and/or an audio signal from the content receiver 80, decode the video signal to image data, and generate dimming data from the image data. The image data and the dimming data may be output to the panel driver 30 and the dimming driver 170, respectively.

The at least one processor 91 may provide dimming data for local dimming to the BLU 100. The dimming data may include information about brightness of each of the plurality of dimming blocks 200. For example, the dimming data may include information regarding an intensity of light output from at least one of the plurality of light emitting devices 111 included in each of the plurality of dimming blocks 200. The dimming data may include information regarding the magnitude of a current applied to light emitting devices 111 included in each of the plurality of dimming blocks 200.

The at least one processor 91 may obtain dimming data from image data decoded from the video signal.

The at least one processor 91 may convert the image data to the dimming data in various methods. For example, the at least one processor 91 may partition the image I from the image data into a plurality of image blocks. The number of the plurality of image blocks may be the same as the number of the plurality of dimming blocks 200, and the plurality of image blocks may correspond to the plurality of dimming blocks 200, respectively.

The at least one processor 91 may obtain brightness values of the plurality of dimming blocks 200 from the image data of the plurality of image blocks. Furthermore, the at least one processor 91 may generate dimming data by combining the brightness values of the plurality of dimming blocks 200.

For example, the at least one processor 91 may obtain the brightness value of each of the plurality of dimming blocks 200 based on a maximum value of brightness values of pixels included in each image block.

An image block includes a plurality of pixels, and image data of an image block may include image data of the plurality of pixels (e.g., red data, green data, blue data, etc.). The at least one processor 91 may calculate a brightness value of each of the pixels based on image data of the pixel.

The at least one processor 91 may determine the maximum value of brightness values of pixels included in an image block as a brightness value of a dimming block corresponding to the image block. For example, the at least one processor 91 may determine a maximum value of brightness values of pixels included in a first image block as a brightness value of a first dimming block, and determine a maximum value of brightness values of pixels included in a second image block as a brightness value of a second dimming block.

The at least one processor 91 may generate dimming data by combining the brightness values of the plurality of dimming blocks 200.

As such, the at least one processor 91 may decode a video signal obtained by the content receiver 80 into image data, and generate dimming data from the image data. Furthermore, the at least one processor 91 may transmit the image data and the dimming data to the liquid crystal panel 20 and the BLU 100, respectively.

Specifically, the at least one processor 91 may decode an input image input through the content receiver 80 into image data, and generate dimming data corresponding to the input image from the image data. In this case, the dimming driver 170 of the BLU 100 may convert the dimming data received from the image processor 90 into a dimming signal that represents a magnitude of current to be applied to each of the plurality of light emitting devices 111 in the dimming block to control the driving device 300.

In an embodiment, the at least one processor 91 may divide the plurality of light emitting devices 111 into a plurality of dimming blocks 200 and control the current to be applied to each dimming block 200 based on a dimming signal corresponding to the input image.

In an embodiment, when there are a plurality of power wires, the at least one processor 91 may control the dimming driver 170 to apply a driving voltage in time slicing in the plurality of power wires.

In an embodiment, when there is a first power wire to supply power to odd rows of the layout of the plurality of dimming blocks 200 and a second power wire to supply power to even rows of the layout of the plurality of dimming blocks 200, the at least one processor 91 may control voltage application through the first power wire and the second power wire in time slicing. Specifically, the at least one processor 91 may control the dimming driver 170 to supply power alternately to the first power wire and the second power wire.

The liquid crystal panel 20 includes a plurality of pixels capable of passing or blocking light, and the plurality of pixels are arranged in the form of a matrix. In other words, the plurality of pixels may be arranged in a plurality of rows and a plurality of columns.

The panel driver 30 may receive image data from the image processor 90, and drive the liquid crystal panel 20 according to the image data. Specifically, the panel driver 30 may convert the image data, which is a digital signal, (hereinafter, referred to as digital image data) to an analog image signal, which is an analog voltage signal, and provide the analog image signal to the liquid crystal panel 20. According to the analog image signal, an optical property (e.g., light transmittance) of the plurality of pixels included in the liquid crystal panel 20 may be changed.

The panel driver 30 may include, for example, a timing controller, a data driver, a scan driver, etc.

The timing controller may receive image data from the image processor 90, and output the image data and a driving control signal to the data driver and the scan driver. The driving control signal may include a scan control signal and a data control signal, which may be used to control operations of the scan driver and the data driver, respectively.

The scan driver may receive the scan control signal from the timing controller, and in response to the scan control signal, input-activate one of the plurality of rows in the liquid crystal panel 20. In other words, the scan driver puts pixels included in a row among the plurality of pixels arranged in the plurality of rows and the plurality of columns into a state of being able to receive analog image signals. In this case, input-deactivated pixels other than the pixels input-activated by the scan driver are unable to receive analog image signals.

The data driver may receive image data and a data control signal from the timing controller, and output image data to the liquid crystal panel 20 according to the data control signal. For example, the data driver may receive digital image data from the timing controller, and convert the digital image data to an analog image signal. Furthermore, the data driver may provide the analog image signal to pixels included in a row input-activated by the scan driver. In this case, the pixels input-activated by the scan driver receive the analog image signal, which makes an optical property (e.g., light transmittance) of the input-activated pixels changed.

In an embodiment, the panel driver 30 may drive the liquid crystal panel 20 according to the image data. Accordingly, an image corresponding to the image data may be displayed on the liquid crystal panel 20.

The dimming driver 170 may receive dimming data from the image processor 90, and drive the BLU 100 according to the dimming data. The dimming data may include information about brightness of each of the plurality of dimming blocks 200, information about brightness of the at least one of the plurality of light emitting devices 111 included in each of the plurality of dimming blocks 200, or information about a magnitude of current to be applied to the at least one of the plurality of light emitting devices 111 included in each of the plurality of dimming blocks 200.

The dimming driver 170 may convert dimming data, which is a digital signal, (hereinafter, referred to as digital dimming data) to an analog dimming signal, which is an analog voltage signal, and provide the analog dimming signal to the dimming block 200. According to an analog dimming signal, the driving device 300 may change intensity of light emitted by the at least one of the plurality of light emitting devices 111 by adjusting the magnitude of current to be applied to the at least one of the plurality of light emitting devices 111 included in each of the plurality of dimming blocks 200.

Especially, the dimming driver 170 may not directly provide the analog dimming signal to all of the plurality of dimming blocks 200, but may sequentially provide the analog dimming signal to the plurality of dimming blocks 200 in an active matrix scheme.

As described above, the plurality of dimming blocks 200 may be arranged in the BLU 100 in the form of a matrix. In other words, the plurality of dimming blocks 200 may be arranged in a plurality of rows and a plurality of columns in the BLU 100, as shown in FIG. 7.

The dimming driver 170 may sequentially provide the analog dimming signal to the dimming blocks belonging to each of the plurality of rows, or sequentially provide the analog dimming signal to dimming blocks belonging to each of the plurality of columns.

For example, the dimming driver 170 may input-activate dimming blocks belonging to a row among the plurality of dimming blocks 200, and provide the analog dimming signal to the input-activated dimming blocks. Subsequently, the dimming driver 170 may input-activate dimming blocks belonging to a row among the plurality of dimming blocks, and provide the analog dimming signal to the input-activated dimming blocks.

The display apparatus 10 may include the dimming driver 170, the plurality of driving devices 300 and the plurality of light emitting devices 111.

Each of the plurality of dimming blocks 200 may include the plurality of light emitting devices 111, for example, 9 light emitting devices 111 (provided as LEDs), as shown in FIG. 7.

The plurality of driving devices 300 may receive analog dimming signals from the dimming driver 170, and may apply driving currents to the plurality of dimming blocks 200 according to the received analog dimming signals.

For example, each of the plurality of driving devices 300 may be arranged between neighboring two columns in the layout of the plurality of dimming blocks 200, and may be electrically connected to at least one of the plurality of dimming blocks 200 included in the neighboring columns to apply a driving current to the at least one of the plurality of dimming blocks 200.

Specifically, each of the plurality of driving devices 300 may receive dimming data from the dimming driver 170 through data lines D1 and D2 as shown in FIG. 7, and may be electrically connected to four (4) dimming blocks 200 included in the left column and four (4) dimming blocks 200 included in the right column among the plurality of dimming blocks 200 included in the neighboring two columns through current wires 350.

In this way, one driving device 300 may be connected to a plurality of dimming blocks 200 to form a driving region 210.

In related art, the driving device 300 configured to drive the dimming blocks 200 in the driving region 210 is arranged in the same driving region 210.

In the related art, the driving device 300 is located in the driving region 210, temperature of the display apparatus 10 increases excessively when a high current is applied thereto for a long time due to e.g., input of a bright image, which may lead to a liquid crystalline collapse phenomenon.

Hence, a method of suppressing such an excessive increase in temperature in the display apparatus 10 by placing the driving device 300 in a separate region from the driving region 210 will now be described.

Figure 8:
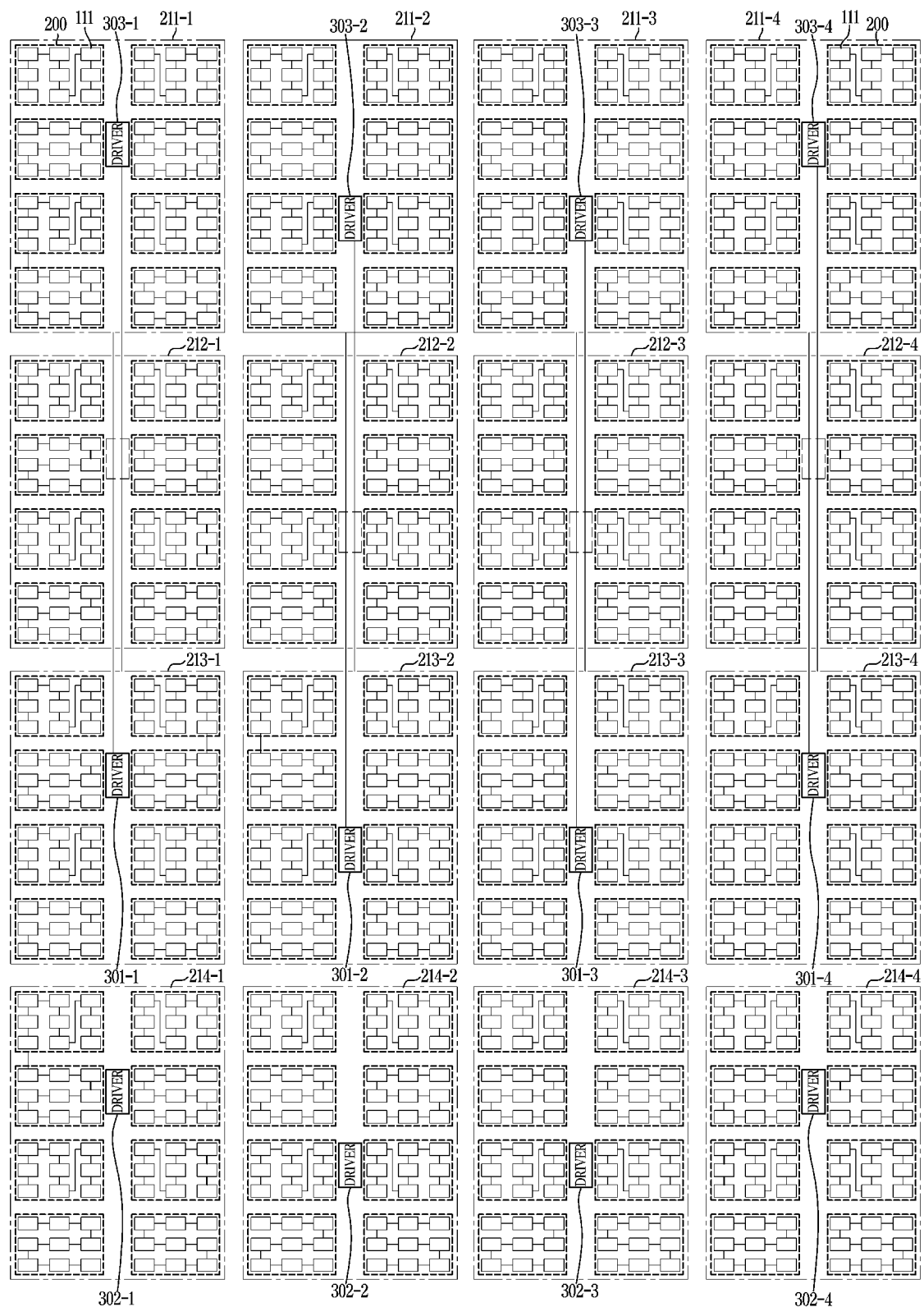
FIG. 8 illustrates a driving device arranged in a separate region from a driving region, according to an embodiment.

FIG. 8 illustrates a driving device arranged in a separate region from a driving region, according to an embodiment. FIG. 9 illustrates a temperature difference in a display apparatus between an embodiment of the disclosure and an existing embodiment.

As described above, the driving region 210 refers to a region where the plurality of dimming blocks 200 are driven by one driving device 300, and the driving regions 210 may be arranged in a two-dimensional (2D) matrix on the substrate as well.

As mentioned above, a predetermined number of light emitting devices 111 among the plurality of light emitting devices 111 may form (or establish) one dimming block 200, and the driving region 210 may be a region where the predetermined number of such dimming blocks 200 are included and driven by the driving device 300.

The driving device 300 may drive a plurality of the light emitting devices 111 included in each of the plurality of driving regions 210.

In the related art, as shown in FIG. 7, the driving device 300 is arranged in the driving region 210, and accordingly, as described above, there is a sharp increase in temperature in the display apparatus 10.

In FIG. 8, a driving device 301-1 for driving a driving region 211-1 arranged in first row and first column is arranged in a driving region 213-1 arranged in third row and first column. That is, one driving device 301-1 among a plurality of driving devices 301-1 to 303-4 may be arranged in a driving region 213-1 driven by another driving device 303-1. By separating a driving device 300 off from the driving region 210 driven by the driving device 300, a sudden rise in temperature may be prevented even with the application of high current. Here, the one driving device 301-1 can be a first driving device, the driving region 211-1 (driven by the one driving device 301-1) can be a first region, another driving device 303-1 can be a second driving device, and the driving region 213-1 (driven by the another driving device 303-1) can be a second driving region.

An operation of arranging (placing) a driving device 300 in a separate region from the driving region 210 driven by the driving device 300 may be performed in various methods.

For example, a driving device 300 (that is configured to drive a driving region 210 arranged in a row among the plurality of driving regions 210) may be arranged in another driving region 210 arranged in another row.

Specifically, a driving device 301 (that is configured to drive a driving region 211 arranged in a first row on the substrate) may be arranged in a driving region 213 arranged in a third row on the substrate, and a driving device 303 (that is configured to drive the driving region 213 arranged in the third row on the substrate) may be arranged in the driving region 211 arranged in the first row on the substrate.

As shown in FIG. 8, the driving device 301 arranged in the driving region 213 (arranged in the third row) may be connected to the driving region 211 arranged in the first row to apply a driving current to drive the driving region 211 arranged in the first row.

Likewise, the driving device 303 (arranged in the driving region 211) arranged in the first row may be connected to the driving region 213 (arranged in the third row) to apply a driving current to drive the driving region 213 arranged in the third row.

In FIG. 8, the driving device 301-1 (that is configured to drive the driving region 211-1 arranged in first row and first column) is arranged in the driving region 213-1 arranged in third row and first column on the substrate, and the driving device 303-1 configured to drive the driving region 213-1 arranged in third row and first column on the substrate is arranged in the driving region 211-1 arranged in first row and first column on the substrate Furthermore, a driving device 302 configured to drive a driving region 212 arranged in a second row on the substrate may be arranged in a driving region 214 arranged in a fourth row on the substrate, and a driving device 304 configured to drive the driving region 214 arranged in the fourth row on the substrate may be arranged in the driving region 212 arranged in the second row on the substrate.

The driving device 302 arranged in the driving region 214 arranged in the fourth row may be connected to the driving region 212 arranged in the second row to apply a driving current to drive the driving region 212 arranged in the second row.

Likewise, the driving device 304 arranged in the driving region 212 arranged in the second row may be connected to the driving region 214 arranged in the fourth row to apply a driving current to drive the driving region 214 arranged in the fourth row.

In another example, a driving device 300 that drives a driving region 210 arranged in a column among the plurality of driving regions 210 may be arranged in another driving region 210 arranged in another column.

In addition to arranging a driving device 300 configured to drive a driving region 210 arranged in a row or a column in another driving region 210 arranged in another row or column, the driving region 210 and the driving device 300 may be separately arranged in various methods.

Furthermore, in arranging and depositing the driving device 300, the driving device 300 may be arranged on an upper surface or lower surface of the substrate. This may facilitate wiring even when the driving device 300 is placed in another position.

By arranging the light emitting devices 111 and the driving device 300 configured to drive the light emitting devices 111 in different regions, a temperature rise in the display apparatus 10 may be reduced even when a high current is applied for a long time due to input of a bright image.

Referring to FIG. 9, in a P-IC module, temperature in the display apparatus 10 is 54.7° C. in the embodiments of the disclosure where the driving device 300 and the driving region 210 are arranged in different regions, whereas temperature in the display apparatus 10 is 71.7° C. in the existing design, which shows that there is a temperature reduction effect of about 17° C. in the embodiments of the disclosure.

In a PCB module, temperature in the display apparatus 10 is 40.5° C. in the embodiments of the disclosure where the driving device 300 and the driving region 210 are arranged in different regions, whereas temperature in the display apparatus 10 is 47.4° C. in the existing design, which shows that there is a temperature reduction effect of about 6.9° C. in the embodiments of the disclosure.

According to an embodiment, a display apparatus includes a substrate; a plurality of driving regions arranged in a 2D matrix on the substrate and each driving region includes a plurality of light emitting devices: a plurality of driving devices each configured to drive a plurality of light emitting devices included in each of the plurality of driving regions, wherein one of the plurality of driving devices is arranged in a driving region driven by another driving device.

According to the embodiments of the disclosure, an excessive temperature rise in the display apparatus may be reduced by arranging light emitting devices and a driving device configured to drive the light emitting devices in different regions.

A driving device configured to drive a driving region arranged in a row among the plurality of driving regions may be arranged in another driving region arranged in another row.

A driving device configured to drive a driving region arranged in a first row on the substrate may be arranged in a driving region arranged in a third row on the substrate, and a driving device configured to drive the driving region arranged in the third row on the substrate may be arranged in the driving region arranged in the first row on the substrate.

A driving device configured to drive a driving region arranged in a second row on the substrate may be arranged in a driving region arranged in a fourth row on the substrate, and a driving device configured to drive the driving region arranged in the fourth row on the substrate may be arranged in the driving region arranged in the second row on the substrate.

A driving device configured to drive a driving region in a column among the plurality of driving regions may be arranged in another driving region in another column.

A predetermined number of light emitting devices among the plurality of light emitting devices may form one dimming block, and the driving region may include a predetermined number of dimming blocks.

The driving device may be arranged on the upper surface or lower surface of the substrate.

According to the embodiments of the disclosure, an excessive temperature rise in the display apparatus may be reduced by arranging light emitting devices and a driving device configured to drive the light emitting devices in different regions.

The embodiments of the disclosure may be implemented in the form of a recording medium for storing instructions to be carried out by a computer. The instructions may be stored in the form of program codes, and when executed by a processor, may generate program modules to perform operations in the embodiments of the disclosure. The recording media may correspond to computer-readable recording media.

The computer-readable recording medium includes any type of recording medium having data stored thereon that may be thereafter read by a computer. For example, it may be a read only memory (ROM), a random-access memory (RAM), a magnetic tape, a magnetic disk, a flash memory, an optical data storage device, etc.

The embodiments of the disclosure have thus far been described with reference to accompanying drawings. It will be obvious to those of ordinary skill in the art that the disclosure may be practiced in other forms than the embodiments of the disclosure as described above without changing the technical idea or essential features of the disclosure. The above embodiments of the disclosure are only by way of example, and should not be construed in a limited sense.

What is claimed is:

1. A display apparatus comprising:
a substrate;
a plurality of driving regions arranged in a plurality of rows and a plurality of columns on the substrate, each of the plurality of driving regions comprising a plurality of light emitting devices; and
a plurality of driving devices configured to drive the plurality of light emitting devices of the plurality of driving regions,
wherein a first driving device of the plurality of driving devices is provided in a first driving region of the plurality of driving regions, and a second driving device of the plurality of driving devices is configured to drive the plurality of light emitting devices of the first driving region,
wherein the first driving device is configured to drive the plurality of light emitting devices of a second driving region of the plurality of driving regions, and
wherein the first driving region and the second driving region are in different rows of the plurality of rows.

2. The display apparatus of claim 1, wherein the second driving device is provided in the second driving region, and
wherein the first driving region is in a first row of the plurality of rows and the second driving region is in a third row of the plurality of rows.

3. The display apparatus of claim 2, wherein the second driving device is configured to apply a second driving current to the plurality of light emitting devices in the first driving region in the first row, and
wherein the first driving device is configured to apply a first driving current to the plurality of light emitting devices in the second driving region in the third row.

4. The display apparatus of claim 1, wherein the second driving device is provided in the second driving region, and
wherein the first driving region is in a second row of the plurality of rows and the second driving region is in a fourth row of the plurality of rows.

5. The display apparatus of claim 4, wherein the second driving device is configured to apply a second driving current to the plurality of light emitting devices of the first driving region in the second row, and
wherein the first driving device is configured to apply a first driving current to the plurality of light emitting devices of the second driving region in the fourth row on the substrate.

6. The display apparatus of claim 1, wherein a predetermined number of light emitting devices among the plurality of light emitting devices correspond to one dimming block, and
wherein each driving region comprises a predetermined number of dimming blocks.

7. The display apparatus of claim 1, wherein each of the plurality of driving devices is provided on an upper surface of the substrate or a lower surface of the substrate.

8. A display apparatus comprising:
a substrate;
a plurality of driving regions arranged in a plurality of rows and a plurality of columns on the substrate, each of the plurality of driving regions comprising a plurality of light emitting devices; and
a plurality of driving devices configured to drive the plurality of light emitting devices of the plurality of driving regions,
wherein a first driving device of the plurality of driving devices is provided in a first driving region of the plurality of driving regions, and a second driving device of the plurality of driving devices is configured to drive the plurality of light emitting devices of the first driving region,
wherein the first driving device is configured to drive the plurality of light emitting devices of a second driving region of the plurality of driving regions, and
wherein the first driving region and the second driving region are in different columns of the plurality of columns.

9. The display apparatus of claim 8, wherein the second driving device is provided in the second driving region, and
wherein the first driving region is in a first column of the plurality of columns and the second driving region is in third column of the plurality of columns.

10. A display apparatus comprising:
a substrate comprising a plurality of driving regions arranged in a plurality of rows and a plurality of columns, each of the plurality of driving regions comprising a plurality of light emitting devices; and
a plurality of driving devices provided in the plurality of driving regions, wherein each driving device is configured to drive the plurality of light emitting devices of a driving region other than a driving region in which the driving device is provided,
wherein a first driving device of the plurality of driving devices is provided in a first driving region of the plurality of driving regions,
wherein a second driving device of the plurality of driving devices is provided in a second driving region of the plurality of driving regions,
wherein the first driving device is configured to drive the plurality of light emitting devices of the second driving region, and
wherein the second driving device is configured to drive the plurality of light emitting devices of the first driving region.

11. The display apparatus of claim 10, wherein the first driving region and the second driving region are in different rows of the plurality of rows.

12. The display apparatus of claim 10, wherein the first driving region and the second driving region are in different columns of the plurality of columns.

* * * * *